United States Patent [19]

Weber

[11] Patent Number: 5,335,147
[45] Date of Patent: Aug. 2, 1994

[54] EMI SHIELD APPARATUS AND METHODS

[75] Inventor: William F. Weber, Allen, Tex.

[73] Assignee: Alcatel Network Systems, Inc., Richardson, Tex.

[21] Appl. No.: 41,522

[22] Filed: Mar. 31, 1993

Related U.S. Application Data

[63] Continuation of Ser. No. 834,908, Feb. 12, 1992, abandoned.

[51] Int. Cl.⁵ .............................................. H05K 9/00
[52] U.S. Cl. .................. 361/818; 174/35 R; 174/35 GC
[58] Field of Search ........... 174/35 R, 35 GC, 35 TS, 174/51; 361/818; 439/108, 109, 607, 608, 609; 257/659

[56] References Cited

U.S. PATENT DOCUMENTS

| 4,370,515 | 1/1983 | Donaldson | 174/35 R |
| 4,661,888 | 4/1987 | Jewell et al. | 361/424 |
| 4,800,464 | 1/1989 | Roos et al. | 174/35 R |
| 5,053,924 | 10/1991 | Kurgan | 361/424 |
| 5,067,232 | 11/1991 | Seidel et al. | 174/35 R |
| 5,107,404 | 4/1992 | Tam | 361/424 |

FOREIGN PATENT DOCUMENTS

| 3211758 | 10/1983 | Fed. Rep. of Germany | 361/424 |
| 3537653 | 4/1987 | Fed. Rep. of Germany | 361/424 |
| 3629913 | 3/1988 | Fed. Rep. of Germany | 174/35 R |
| 3736833 | 5/1989 | Fed. Rep. of Germany | 174/356 C |
| 3809607 | 10/1989 | Fed. Rep. of Germany | 361/424 |
| 4037763 | 6/1992 | Fed. Rep. of Germany | 361/818 |
| 2652227 | 3/1991 | France | 439/607 |
| 1-145897 | 6/1989 | Japan | 174/35 R |
| 2-47896 | 2/1990 | Japan | 361/424 |
| 2-239699 | 9/1990 | Japan | 361/424 |
| 2214000 | 8/1989 | United Kingdom | 174/35 R |

Primary Examiner—Leo P. Picard
Assistant Examiner—Donald A. Sparks
Attorney, Agent, or Firm—Baker & Botts

[57] ABSTRACT

A top cover and bottom cover made of an electrically conductive material that absorbs and reflects electromagnetic interference (EMI) signals are formed to fit without solder or welding as an EMI shield apparatus over EMI susceptible electronic circuitry on a printed circuit board. The EMI shield apparatus shields the circuitry from EMI while at the same time permitting the communication of desired electromagnetic radio frequency and electrical signals to the circuitry. The EMI shield apparatus includes the use of an electrically conductive layer that is integral to the top and bottom sides of the printed circuit board and which includes conductive channels that penetrate the printed circuit board. The channels prevent EMI from passing through the printed circuit board to the electronic circuitry. Also, the channels receive tangs found both on the top cover and bottom cover. The tangs are positioned to prevent EMI from passing through the top and bottom cover junctures with the conductive layer. As EMI signals reach the shield apparatus, they are absorbed and conducted through the shield EMI apparatus to an electrical ground or reflected from the EMI shield. Openings on the top cover permit desired electromagnetic radio frequency signals to reach the electronic circuitry. Passageways through the conductive layer permit electrical leads from the electronic circuitry to connect to external circuitry.

2 Claims, 5 Drawing Sheets

EMI SHIELD APPARATUS AND METHODS

CROSS REFERENCE TO RELATED APPLICATIONS

This application is a continuation of application Ser. No. 07/834,908 filed Feb. 12, 1992, entitled "EMI Shield Apparatus and Methods" by William F. Weber, now abandoned.

TECHNICAL FIELD OF THE INVENTION

The present invention is related generally to electronics, and more specifically to packaging of electronics to limit the communication of EMI (electromagnetic interference) signals. Even more specifically, the invention is related to packaging electronic circuitry on a printed circuit board within an EMI shield while permitting desired electromagnetic radio frequency and electrical signals to communicate with the electronic circuitry.

BACKGROUND OF THE INVENTION

The prior art packaging of printed circuit boards containing electronic circuitry to prevent EMI signals from leaving the package or from reaching and adversely affecting highly-susceptible electronic circuitry within the package is both labor intensive to manufacture and service and suffers from several functional limitations. Keeping EMI from leaving an electronics module that contains EMI-emitting components has required soldering certain shielding materials to the printed circuit board and fastening other shielding materials to the soldered shielding material using various screws or other fastening hardware. Keeping EMI from reaching and affecting susceptible electronic circuits in an electronics module, on the other hand, has required placing the printed circuit board fully in a sealed box made of a material that the effectively shields most of the EMI signals.

In typical packages that shield EMI emitting components, several pieces are soldered to the printed circuit board and as many as 20 or more pieces of fastening hardware affix to the soldered pieces to provide the necessary level of shielding. This labor-intensive practice of soldering and fastening prior art shielding enclosures to printed circuit boards increases the electronics module fabrication costs. Moreover, with prior art shielding enclosures it is not possible to easily replace or repair electronic circuitry components on the printed circuit board. This is due to circuitry components often being tightly positioned adjacent the soldered shield pieces that are not easily removable from the printed circuit board. This causes servicing EMI-shielded printed circuit boards also to be time-consuming and expensive.

Prior art packaging for preventing EMI signals from reaching and affecting EMI susceptible circuits in an electronics module suffers from other limitations. Using soldered and fastened shield materials is generally impractical because an unacceptable level of EMI leakage often occurs in such designs. Therefore, prior art devices for shielding susceptible electronic circuits from EMI use sealed boxes made of aluminum or some other electrically conductive material that fully enclose the printed circuit board. The EMI shield boxes of the prior art have sealed edges that keep EMI away from the sensitive electronic circuitry while often providing a way for radio frequency signals to reach the electronic circuits. These types of sealed EMI shield boxes, however, are cumbersome, expensive, labor intensive and require significant amounts of storage space in electronics cabinets designed to hold them.

An even more serious limitation that the prior art EMI shield boxes impose relates to the fact that numerous electronics cabinet designs call for easy installation and removal of the shielded electronics module. Some newer electronics cabinet designs require that the printed circuit boards be directly plugged into the electronics cabinets. This requires exposing a large portion of the printed circuit board outside the EMI shield. With the prior art EMI shield boxes, however, exposing the printed circuit board makes it possible for EMI to pass through the printed circuit board and to the susceptible electronic circuitry.

It is thus an object of the present invention to provide a shielding apparatus for electronic circuitry on a printed circuit board that allows solderless installation of an EMI shield to produce an electronics module that has a high degree of EMI shielding and that permits extensive communication of desired electromagnetic radio frequency and electrical signals by exposing from out of the EMI shield certain portions of the printed circuit board.

BRIEF DESCRIPTION OF THE DRAWINGS

Other objects and advantages of the present invention will be apparent from a reading of the specification and appended claims in conjunction with the drawings, wherein:

DETAILED DESCRIPTION OF THE INVENTION

Figure 1:
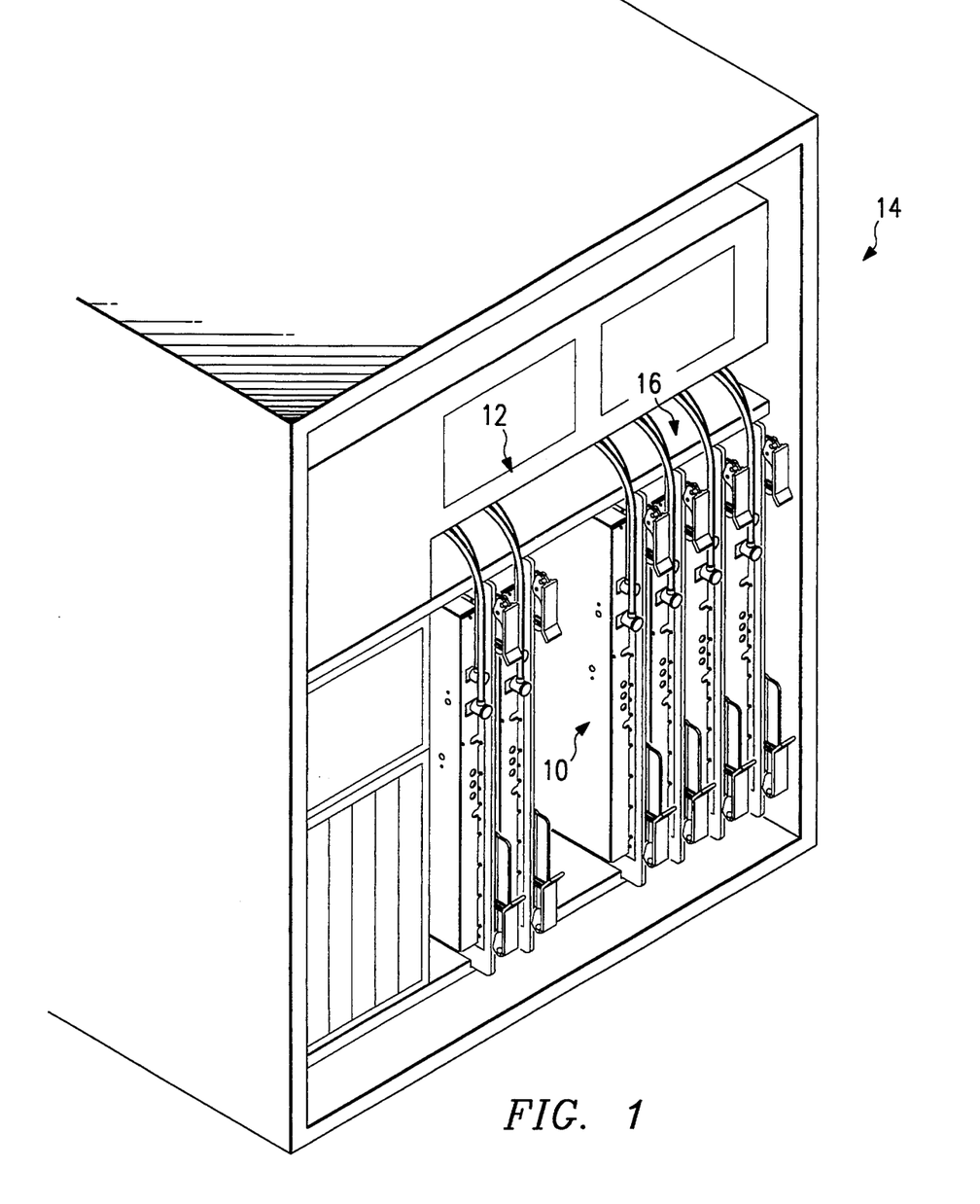
FIG. 1 shows a card cage of a communications electronics cabinet that may establish a typical physical and EMI environment for the present invention.

In FIG. 1 appears a typical environment for employing the preferred embodiment of the present invention. Electronics module 10 may, for example, be a communications receiver module that fits within card cage 12 of communications electronics cabinet 14. Electronics cabinet 14 may contain a plurality of such communications electronics modules 10 plugged side-by-side in slots such as slot 16. Communications electronics cabinet 14 receives each of the electronics modules 10 and electrically connects circuitry inside each electronic module 10 to other components of communications electronics cabinet 14. Communications electronics modules 10 may take a low level signal from a remote transmitter and amplify the signal, separate an information portion of the signal from a carrier portion, and add information to the signal. It is very important that EMI not adversely affect these operations. Therefore, the embodiment of the present invention provides this necessary EMI shielding.

Figure 2:
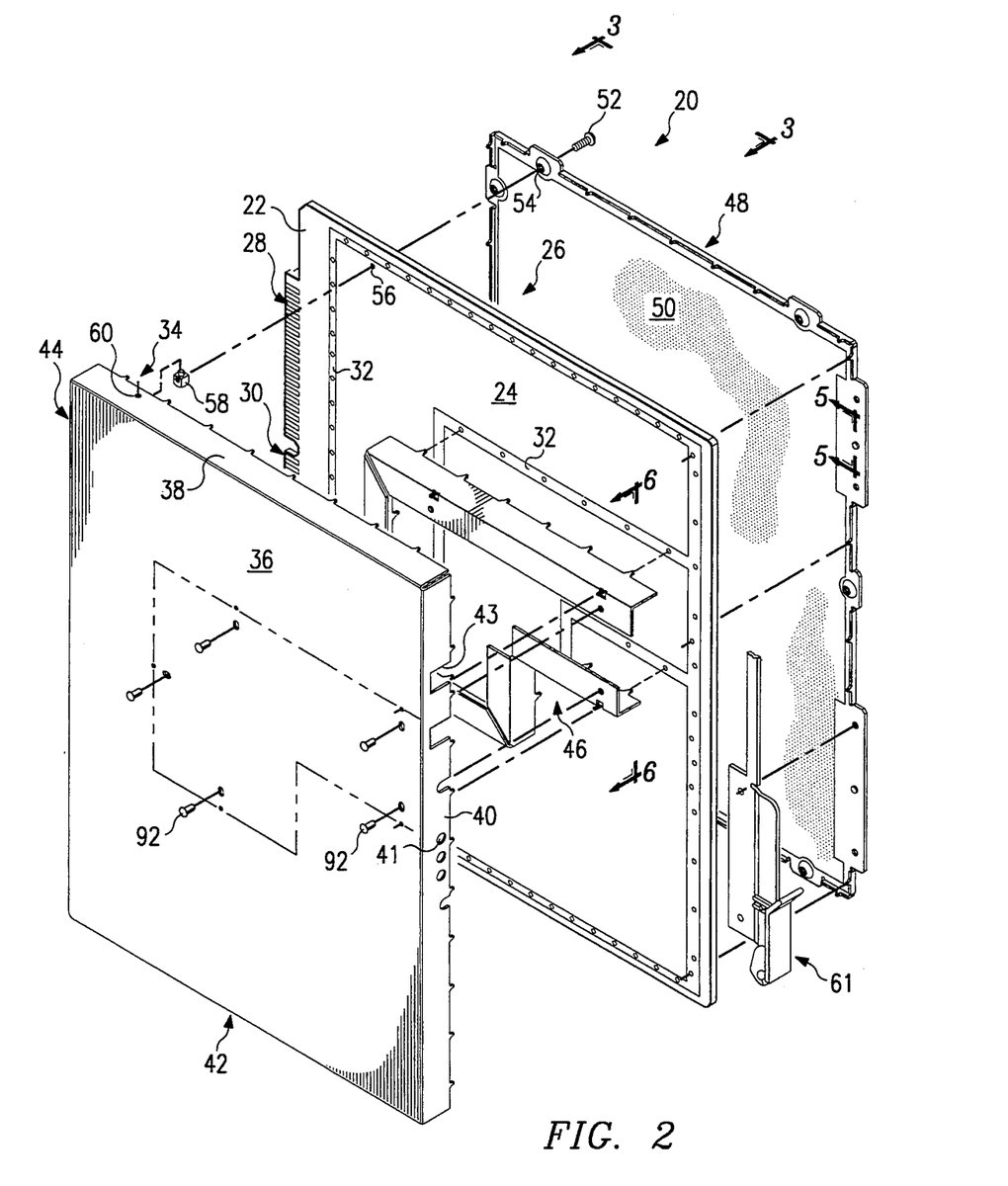
FIG. 2 shows an exploded view of the preferred embodiment of the present invention.

FIG. 2 shows the preferred embodiment of the printed circuit board shielding method and apparatus 20 of the present invention that together with associated electronic circuitry forms electronics module 10 of FIG. 1. Referring to FIG. 2, printed circuit board 22 includes top side 24 and bottom side 26 for connecting and holding electronic circuitry (not shown). Electrical leads or traces 28 and 30 may connect printed circuit board 22 to associated receptacles of the communications electronics cabinet 14 of FIG. 1. Additionally, printed circuit board 22 includes electrically conductive layer or perimeter 32 designed to surround electronic circuitry installed on top side 24. The shield apparatus 20 of the preferred embodiment includes top portion 34 having integral to it top shield 36 and side shields 38, 40, 42 and 44. Side shield 40 permits connecting various coaxial cable connectors as well as displaying internal display lights, test points or other indications on the electronic circuitry through openings such as opening 41. Additionally, openings such as opening 43 permit coaxial cable connectors or other connectors to pass through top cover 34 for electrical connection to the internal electronic circuitry. Internal shield 46 may attach to the internal side of top cover 34.

On bottom side 26 of printed circuit board 22 attaches bottom cover 48. Bottom cover 48 includes insulating material 50 to electrically separate the electronic circuitry that may protrude from bottom side 26 to the shield material of bottom cover 48. Insulating material 50, however, may not be necessary if bottom cover 48 is sufficiently tall to prohibit contact with circuitry that may pass through the bottom of printed circuit board 22. Several screws such as screw 52 pass through associated holes 54 of bottom cover 48 and holes 56 of printed circuit board 22 to screw blocks 58. Blocks 58 mount to top cover 34 through mounting holes 60. The preferred embodiment may also include handle 61 to permit the removal of electronics module 10 from card cage 12 of communications electronics cabinet 14 of FIG. 1, for example.

As FIG. 2 illustrates, the preferred embodiment provides top cover 34 and bottom cover 48 that grip between them printed circuit board 22. Top cover 34 is made of aluminum in the preferred embodiment, however, other electrically conductive materials capable of effectively shielding EMI such as copper or steel may also be used. Although the preferred embodiment uses a single integral top cover 34, top cover 34 may be made with a single piece top shield 36 and side shields 38, 40, 42, and 44 made of one, two, three or four separate sides. These pieces may then connect together with top shield 36 to fit as a unit over printed circuit board 22. For example, side shields 38, 42, and 44 may be formed of a single C-shaped strip of conductive material with side 40 and top shield 36 as separate pieces of shielding. If the top shield 36 of top cover 34 is a separate piece, a foil gasket backed with a silicone material may be necessary to assure a good electrical connection between top shield 36 and the side shields 38, 40, 42 and 44.

Bottom cover 48 typically is made of the same material as top cover 34, but other materials capable of shielding EMI may also be used. Insulating material 50 typically is a sheet of plastic or other material that adheres to bottom cover 98. Fastening means other than screws 52 to blocks 58 may also be used. For example, rivets or a press fitting may be used to grip printed circuit board 22 between top cover 34 and bottom cover 48.

Figure 3:
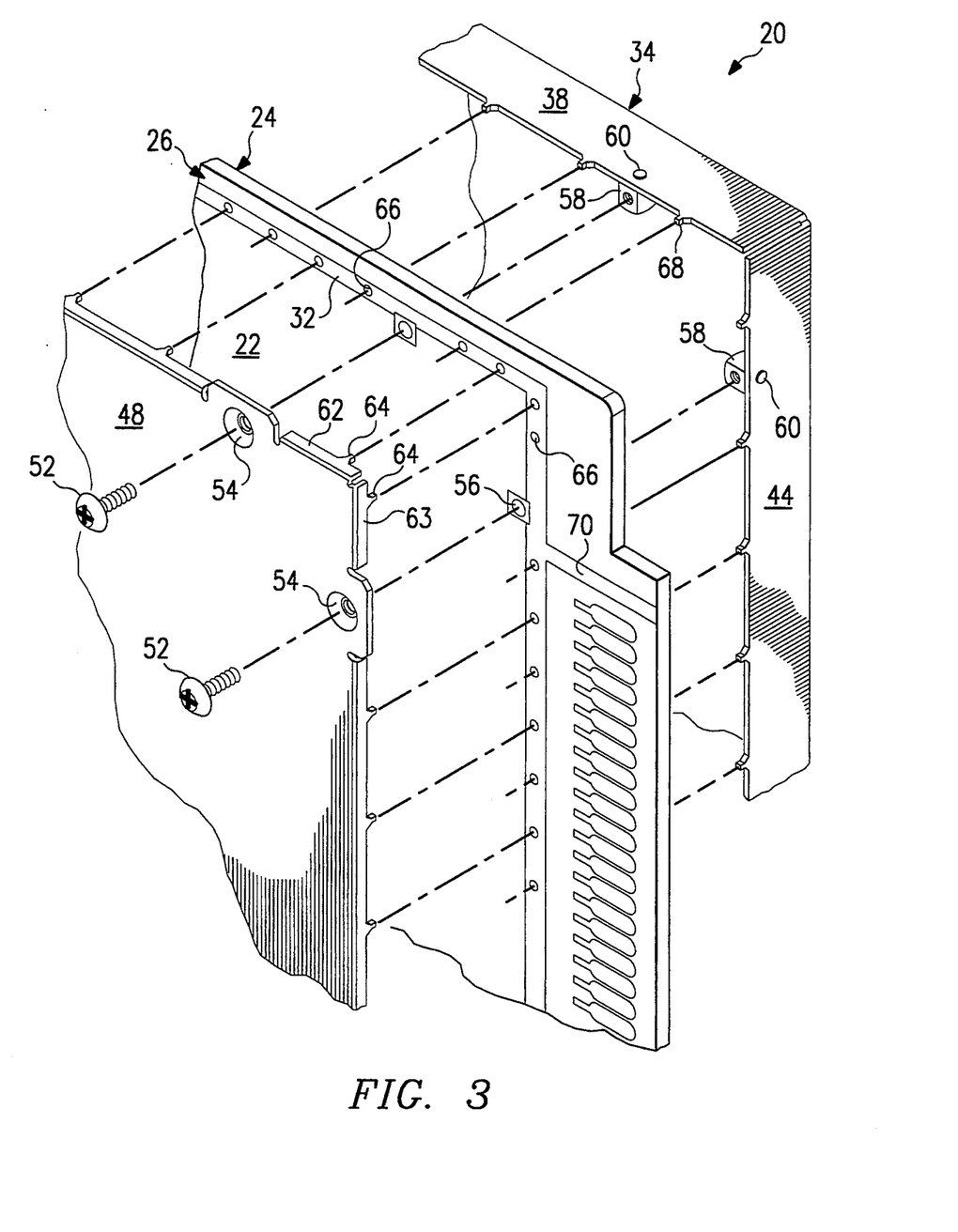
FIG. 3 shows a more detailed, exploded partial view of the preferred embodiment for more particularly illustrating the cooperation among its various components.

FIG. 3 provides a more detailed view of shield apparatus 20 of FIG. 2 to illustrate more precisely the mechanical cooperation of the EMI shield components of the preferred embodiment. Referring to FIG. 3, bottom cover 48 has vertical sides 62 and 63 that include tangs such as tangs 64. Tangs 64 fit into certain of conductive paths or channels 66 of perimeter 32. The height of sides 62 and 63 is sufficient to permit recessing screws 52 within holes 54 of bottom cover 48 so that when screwed down, the heads of screws 52 are flush with the outer surface of back cover 48. The height of hole 54 also minimizes distortion of sides 62 and 63 that may occur when screw 52 is screwed down.

Vertical sides 38 and 44 of top cover 34 also appear in FIG. 3. On vertical sides 38 and 44 are tangs such as tang 68 that fit in the remaining channels 66 of printed circuit board 22. It should be noted that perimeter 32 of printed circuit board 22 appears as a conductive metal layer on both top side 24 and bottom side 26 of printed circuit board 22. Channels 66 penetrate fully through printed circuit board 22 for receiving either tangs 64 from bottom cover 48 or tangs 68 from top cover 34. Channels 66 have an internal conductive layer that electrically connects to perimeter 32. Perimeter 32 connects to ground lead 70. Ground lead 70 provides a way to electrically connect perimeter 32 and channels 66 to an electrical ground.

As FIGS. 2 and 3 illustrate, the preferred embodiment provides an EMI-shielded enclosure that is simple to place over and remove from the electronic circuitry of printed circuit board 22. In particular, no welding or soldering of side shields 38, 40, 42, and 44, is necessary with the preferred embodiment. Moreover, channels 66 and screw holes 56 form an EMI barrier that prevents EMI from passing through the edge of printed circuit board 22 and into the interior of the EMI shield enclosure that top cover 34 and bottom cover 48 establish.

Screw holes 56 and channels 66 are spaced not more than approximately one-half inch from each other in the preferred embodiment. The one-half inch distance is a function of the frequency of the EMI for which the components inside the EMI shield are most susceptible. Additionally, the distance between tangs 62 of bottom cover 48 and tangs 68 of top cover 32 do not exceed one-inch in the preferred embodiment for the same reason. To accomplish this, tangs 62 generally alternate their engaging channels 66 with the tangs 68 engaging the remaining channels 66. It also warrants pointing out that openings 41 and 43 on side shield 40 (see FIG. 2) do not make an opening greater than one-inch in any direction.

If the frequency of EMI for which electronics circuitry of electronics module 10 is susceptible is higher than the 70 MHz EMI signal for which EMI shield apparatus 20 is designed, then it may be necessary to reduce the distance between tangs 64 on bottom cover 48 and tangs 68 on top cover 34.

Another significant benefit of the preferred embodiment is that it makes possible straddling a component of the printed circuit board. For example, circuitry that is not susceptible to EMI may be placed outside the EMI enclosure. By connecting circuitry through the printed circuit board and not in contact with either channels 66 or screw holes 56 it is possible to electrically connect circuitry inside to circuitry outside the EMI shield.

It may be possible to establish an EMI enclosure without the use of channels 66 by having tangs 64 and 68 simply contact continuous perimeter 32. This, however, will not prohibit EMI from passing through printed circuit board 22, unless some form of conductive shield material other than the internal surfaces of channels 66 also penetrates printed circuit board 22 at the same spacing as channels 66.

Yet another advantage of the preferred embodiment exhibits is that it provides a significantly simpler assembly relative to prior art EMI enclosures. Not only does the preferred embodiment significantly reduce the necessary hardware (e.g., the prior art soldered and fastened EMI enclosure requires between 12 and 18 pieces of hardware such as screws for assembly, whereas the preferred embodiment requires between only 10 and 12 pieces of hardware), but also the preferred embodiment substantially reduces the piece part count (e.g., the prior art soldered and fastened EMI enclosure requires six pieces for shielding whereas the preferred embodiment needs only three pieces (i.e., top cover 34, insulator 50, and bottom cover 48)).

Yet another significant benefit of the preferred embodiment is that it may be completely assembled from a downward orientation. In other words, assembly of the preferred embodiment may occur by first placing top cover 34 with its internal side upward on a flat surface. The next step is to install printed circuit board 22 over top cover 32 to engage channels 66 with tangs 68. Next, if handle 61 is necessary, it may be placed on printed circuit board 22. Bottom cover 48 is then placed over printed circuit board 22 and handle 61 to engage channels 66 with tangs 64. Finally, screws 52 are installed in holes 54 to pass through printed circuit board 22 and to blocks 58 to fasten top cover 34 and bottom cover 48 to printed circuit board 22.

Figures 4, 5:
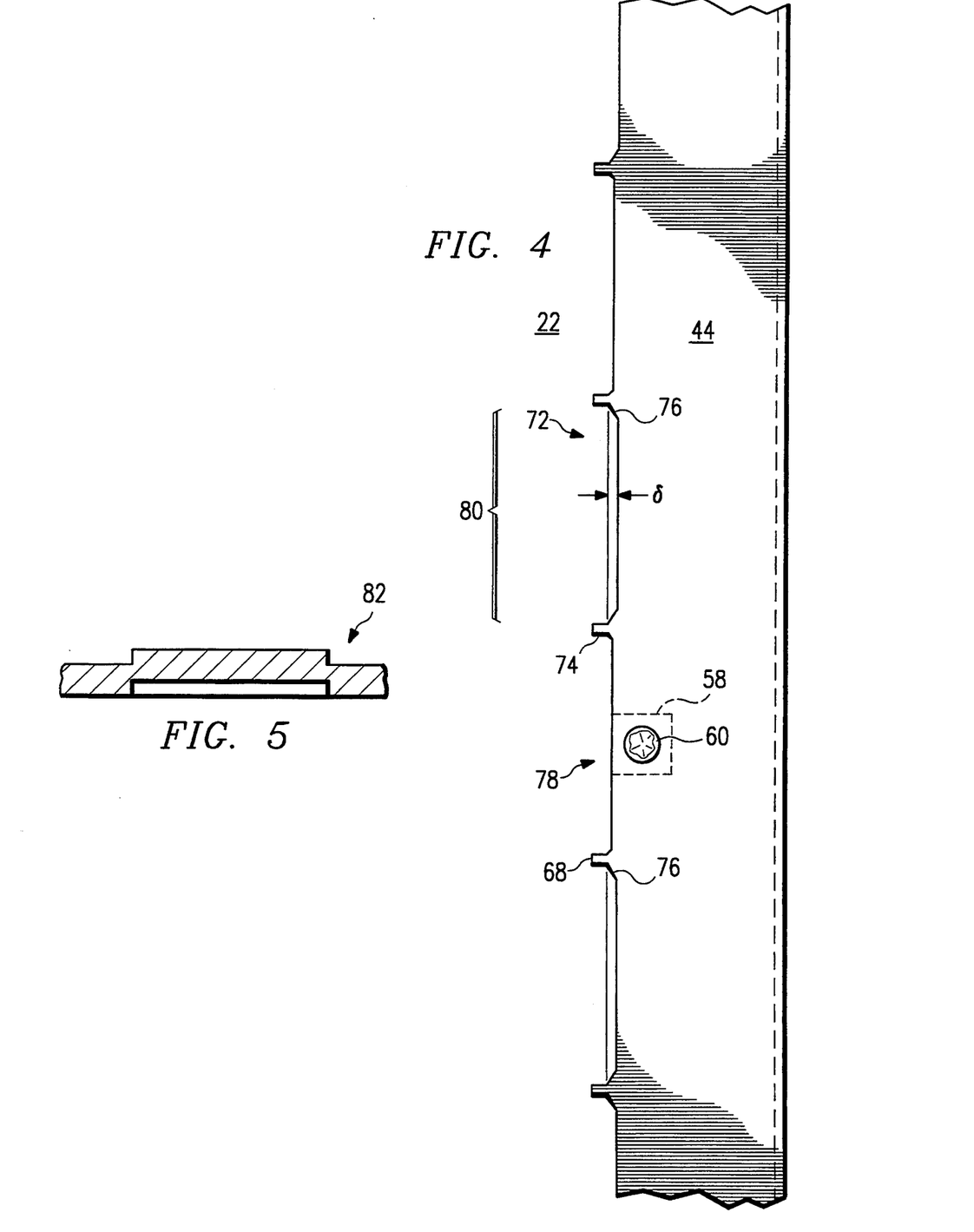
FIG. 4 shows a view of the top cover to illustrate the design of shield grounding tangs and trace signal passageways of the preferred embodiment.
FIG. 5 shows a side cut-away view of a portion of the bottom cover of the preferred embodiment.

FIG. 4 provides a side view of a cut-away portion of vertical shield side 44 to show more particularly shield grounding tangs 68 and trace signal openings such as opening 72. Vertical sides 38, 40, and 42 also have positioning tangs 68, but not signal trace openings 72. As FIG. 4 shows, tangs 68 protrude from side 44 of top cover 34 to ensure electrical contact between top cover 34 and channels 66 of perimeter 32. Although the preferred embodiment uses rectangular tang tips such as tip 74, the tang tips 74 may be rectangular, square, oval or circular in cross-section depending on the particular ease of design of other parameters affecting their manufacture. Similarly, tang angles such as angle 76 permit tang tips 74 to be sufficiently small relative to the diameter of channels 66. This permits a significant amount of free play in the positioning of tangs 68 as they engage channels 66. With this level of free play, tang angles 76 assure that upon fastening top cover 34 to printed circuit board 22 a good electrical contact occurs. This assures that top cover 34 is electrically grounded. For this purpose, tang angle 76 may provide a straight edge, as in the preferred embodiment, or may form a quarter circle or curved edge, depending upon the applicable manufacturing limitations, if any.

An important consideration of the preferred embodiment, which has application as an EMI shield for a communications receiver module, is to admit traces into the receiving components of the electronic circuitry on printed circuit board 22. For example, electronics module 10 may contain circuitry that receives signals from traces that run to the outer edge of printed circuit board 22. For this purpose, side shield 44 of top cover 34 provides different side shield heights among certain of the alternating spaces between tangs 68. As FIG. 4 demonstrates, a difference $\delta$ in height between trace signal opening 72 and opening 78 exists. The height difference $\delta$ causes trace signal opening 72 to form a gap or opening equal to the difference $\delta$ in height between shield side 44 and printed circuit board 22 when top cover 34 fastens to printed circuit board 22. For the preferred embodiment, this opening having height $\delta$ has a width 80 of approximately one-inch due to the spacing of tangs 68. This gap or opening area provides a sufficiently long slot line to permit power to reach the electronic circuitry of electronics module 10. The one-inch separation, however, prevents undesirable EMI from passing through and affecting the EMI-susceptible electronic circuitry.

Maintaining the integrity of the EMI barrier at junctures between top cover 34 and printed circuit board 22 top side 24 and bottom cover 48 and bottom side 26 is an essential characteristic of the preferred embodiment. This may require modification of either printed circuit board 22, top cover 34, or bottom cover 48 when component placement restricts the ability to use tangs 68 or 64. For example, at the point where handle 61 (see FIG. 2) contacts bottom cover 48 it is not possible to easily use a positioning tang 64. FIG. 5 shows a cross-section of a portion of bottom cover 48 to illustrate how the preferred embodiment overcomes this situation.

FIG. 5 illustrates a half-shear 82 that may be used on bottom cover 48 to provide an EMI shield at the point where bottom cover 48 covers handle 61. By half shearing bottom cover 48 to produce an indentation having a depth approximately one-half that of the thickness of the bottom cover 48 sheet metal, it is possible to maintain the integrity of the approximately one-inch EMI barrier at all points around bottom cover 48.

Figure 6:
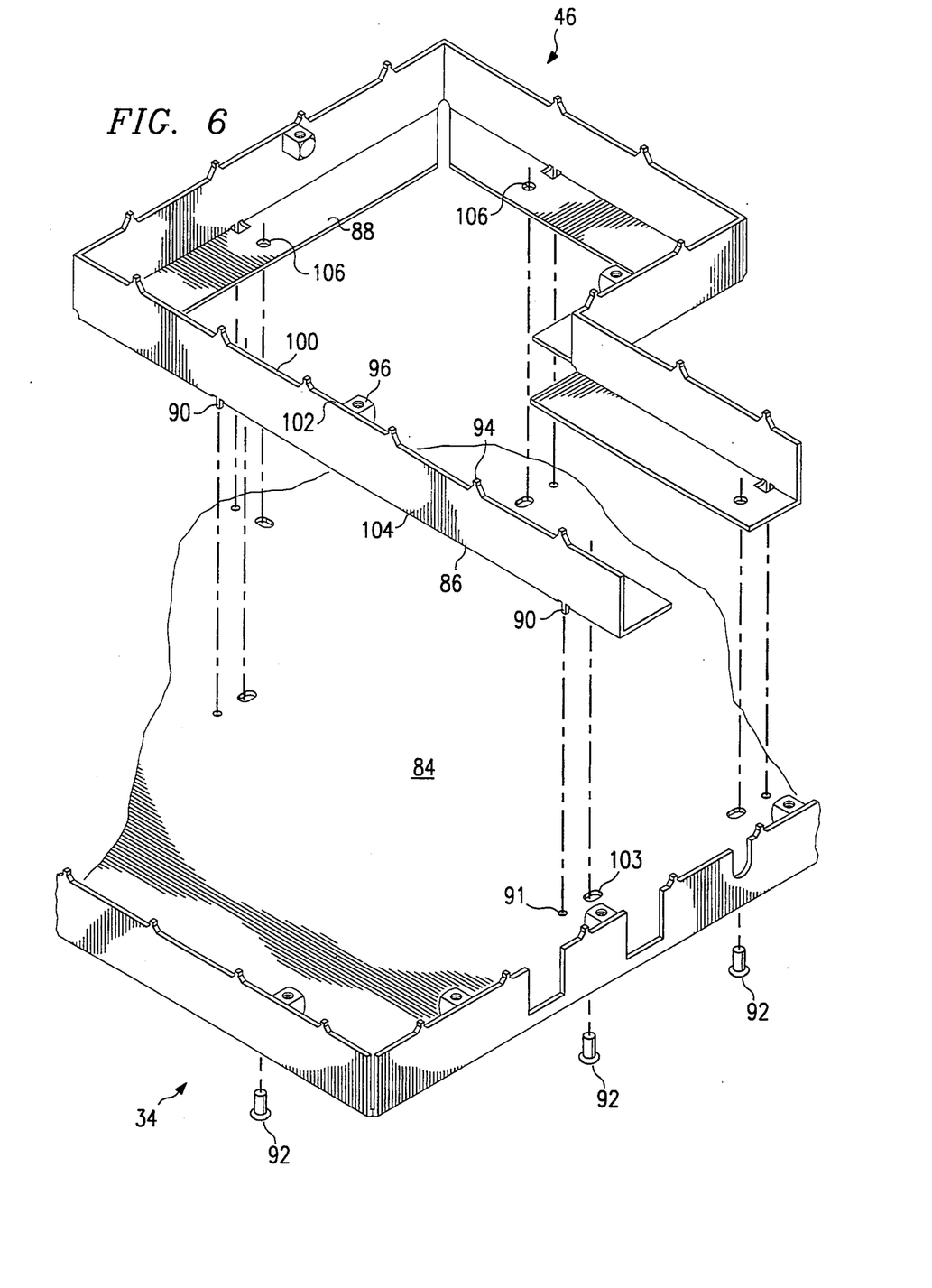
FIG. 6 is an exploded view of the top cover of the preferred embodiment that illustrates the placement and design of an internal shield of the preferred embodiment.

FIG. 6 illustrates an exploded isometric diagram of the internal shield 46 of the preferred embodiment. In particular, internal shield 46 contacts top cover 34 on inside surface 84. Internal shield 46 has side shield surfaces that form vertical shield 86 that may follow the contour of a conductive layer placed within and electrically connected to conductive perimeter 32 of the preferred embodiment. Such a conductive layer would surround a predetermined portion of the electronics circuitry on printed circuit board 22. The function of internal shield 46 is to isolate a circuit from within top cover 34. The embodiment that FIG. 6 shows has five straight surfaces that form vertical shield 86. Integral and perpendicular to vertical shield 86 is horizontal mounting edge 88. Mounting edge 88 folds parallel to inside surface 84 for placement thereon. In order to mount internal shield 46 to inside surface 84, the preferred embodiment coordinates the use of self-positioning tangs such as self-positioning tang 90 and pop rivets such as pop rivet 92.

Internal shield 46, like top cover 34 and bottom cover 48, includes tangs such as tang 94 to engage corresponding channels that may be placed within a conductive layer on printed circuit board 22. Also similar to top cover 34, internal shield 46 uses blocks such as block 96 that mount to mounting hole 98 (not shown) to receive a fastening screw such as screw 52 of FIG. 2. As FIG. 6 further illustrates, internal shield 46 also has spaces to establish trace signal opening such as edge 100 that, for example, differs in height from edge 102 by a distance sufficient to permit the communication of desired signal traces. The size of internal shield 46 depends on the desired electronic circuitry on printed circuit board 22 for which internal shield 46 is necessary.

Positioning tangs 90 aid in self-positioning internal shield 46 on inside surface 84. Positioning tangs 90 extend beyond edge 104 of internal shield 46. When internal shield 46 is placed in contact with inside surface 84, positioning tangs 90 drop into holes such as hole 91 to align internal shield 46 to its proper location. When internal shield 46 is in position, pop rivets 92 pass through associated holes such as hole 103 of top cover 34 and hole 106 of mounting edge 88. Holes 103 may be slightly larger than the shaft of pop rivet to permit a slight degree of free play when fastening internal shield 46 to top cover 34. Once in place, pop rivets 92 may be forced or pressed to secure internal shield 46 to top cover 34.

Positioning tangs 90 may be rectangular or square in shape depending on the particular manufacturing or design objectives or limitations. Other methods of fastening internal shield 46 to inside surface 84 may include screws, soldering, brazing, or press fitting or other methods of fastening. By fastening internal shield 46 to top cover 34, upon the removing top cover 34 all circuitry on printed circuit board 22 is immediately accessible for factory repair or replacement.

Internal shield 46 represents a significant improvement over prior art methods and apparatuses to isolate selected circuits on a printed board from other circuits within the EMI enclosure of the preferred embodiment. In particular, internal shield 46 is a solderless way of separating specific circuits from other circuits in the enclosure. This has the advantage of making those circuits accessible and not restricted in accessibility by the soldered vertical shield to the prior art. Another technical advantage that internal shield 46 provides relates to the way that positioning tangs 90 cooperate with engaging tangs 94. By having self-positioning tangs 90 and engaging tangs 94 on the same vertical shield 88, this enhances alignment of engaging tangs 94 with the associated grounding channels of printed circuit board 22.

OPERATION

The basic operation of the preferred embodiment is very straight forward once conceived and comprises placing top cover 34 and bottom cover 48 so as to grip and hold firm printed circuit board 22. As EMI reaches the electronics module 10 that results when placing the appropriate circuitry on printed circuit board 22, from the top of the module top cover 34 prevents EMI from reaching and affecting the electronic circuitry side shields 38, 40, 42, and 44 prevent EMI from reaching the electronic circuitry from the sides. Back cover 48 prevents EMI signals from reaching the bottom portion of the circuitry positioned on printed circuit board 22. Although EMI might otherwise pass through the juncture between top cover 34 and printed circuit board 22 and, similarly, bottom cover 48 and printed circuit board 22, positioning tangs 68 and 64, respectively, together with channels 66 prevent this from happening.

The EMI signals of concern for the preferred embodiment have a frequency of approximately 70 MHz. This frequency yields a signal with an approximately 168-inch wavelength. A factor of 30 divides this wavelength to specify the maximum hole size for the EMI shield. The 30 factor limit the EMI shield apparatus 20 to a maximum hole spacing of 5.6 inches. The preferred embodiment protects the electronic circuitry from the fifth harmonic of the EMI. This even further limits the EMI shield to only a 1.12 inch maximum hole spacing. Since the preferred embodiment has no opening greater than one-inch in size, strong levels of EMI do not reach the electronic circuitry that EMI shield apparatus 20 protects. In fact, testing of the EMI shield of the preferred embodiment shows a 6 dB improvement over the prior art EMI shielding mechanisms designed to protect susceptible electronic circuits.

The operation of internal shield 46 of FIG. 6 provides similar EMI shield operation. Additionally, internal shield 46 isolates circuitry within internal shield 46 from other circuitry in electronics module 10.

The operation of the preferred embodiment may also extend to using the present invention to prevent EMI transmission from an electronics module. If EMI shield apparatus 20 were to enclose a communications transmitter module, it would prevent EMI from leaving EMI-generating circuitry. When used in this way, EMI shield apparatus 20 not only serves to shield susceptible electronic circuitry from EMI, but also may be used to prevent transmission of EMI to enhance electromagnetic compatibility within a communications electronics cabinet.

EMI shield apparatus 20 provides a high degree of electromagnetic compatibility (EMC) among adjacent electron modules 10. As use herein, electromagnetic compatibility is the ability of electronic system to function properly in its intended electromagnetic environment and not be a source of electromagnetic signal pollution to that environment. This enhances the operation of other units within card cage 12 of FIG. 1, for example. The preferred embodiment of the present invention achieves a high degree of EMC by significantly reducing the amount of EMI reaching susceptible components within the electronic circuitry of electronics module 20, while at the same time preventing the leakage of the EMI from components that operate within the shielded environment of the preferred embodiment.

In summary, we have illustrated one embodiment of the inventive concept of an EMI shield apparatus that encloses a printed circuit board and that permits easy, solderless installation while producing a highly EMI-shielded electronics module by placing around the susceptible circuitry an EMI shield layer that prohibits EMI from passing through the edges of the circuitry and gripping the printed circuit board between an EMI shield top cover and an EMI shield bottom cover with specially designed tangs integral to the top and bottom covers to make connections to the EMI layer on the printed circuit board while permitting extensive communication of desired radio frequency and electrical signals with the enclosed electronic circuitry.

We wish to be limited, not by the single embodiment illustrated and described, but only by the scope of the appended claims wherein we claim:

1. A printed circuit board assembly for containing electronic circuitry and isolating EMI from the electronic circuitry, comprising:
   a printed circuit board for holding the electronic circuitry and comprising a plurality of leads for permitting electrical connection to the electronic circuitry, said printed circuit board having a top side and a bottom side;
   an electrically conductive perimeter comprising an electrically conductive layer integral to said printed circuit board and surrounding the electronic circuitry, said electrically conductive perimeter permitting electrical leads to the electronic circuitry to pass under and separate from said perimeter to an edge of said printed circuit board;

a top housing comprising a first electrically conductive shield materials for covering and isolating said top side and the electronic circuitry from EMI, said top housing further comprising a predetermined set of trace signal openings for permitting passage of electrical connectors to said electronic circuitry;

a first plurality of tangs for engaging said electrically conductive perimeter to form a solderless removable electrical connection with said first shield material to said perimeter;

a bottom housing comprising a second electrically conductive shield material for covering and isolating said bottom side and said electronic circuitry from EMI;

a second plurality of tangs for engaging said electrically conductive perimeter to form a solderless removable electrical connection with said second shield material to said perimeter; and fastening means for fastening said top housing and said bottom housing to said electrically conductive perimeter for establishing an EMI shield enclosure for the electronic circuitry while permitting exposure of said leads.

2. An apparatus for shielding an electronic circuit from EMI, the apparatus comprising:

a top portion;

a bottom cover;

a printed circuit disposed between the top portion and the bottom cover, the printed circuit board for holding the electronic circuit, the printed circuit board having a conductive perimeter surrounding the electronic circuit and having a plurality of conductive channels therethrough;

the top portion comprising:
a top shield formed with a first plurality of holes therethrough, a plurality of side shields, each side shield having a first longitudinal edge and a second longitudinal edge, the plurality of side shields and top shield formed from a integral piece of metal with the first edge of the side shield adjacent to the top shield, a first plurality of grounding tangs formed on the second edge of each of the side shields of the plurality of side shields, each tang of the plurality of grounding tangs for mating with one channel of the plurality of conductive channels to form a solderless removable electrical contact, and the second edge of at least one side shield of the plurality of side shields formed to have a trace signal opening between two of the plurality of grounding tangs along the second edge to allow a circuit lead to run from the electronic circuit to an edge of the printed circuit board;

an internal shield attached to the top shield of the top portion, the internal shield comprising:
a plurality of side shield surfaces, each side shield surface of the plurality of side shield surfaces having a first longitudinal edge and a second longitudinal edge, a second plurality of grounding tangs attached to the first longitudinal edge of each side shield surface of the plurality of side shield surfaces, each tang of the second plurality of grounding tangs for mating with one channel of the plurality of conductive channels through the printed circuit board to form a solderless removable connection therebetween, a plurality of self-positioning tangs attached to the second longitudinal edge of at least one of the plurality of side shield surfaces, each tang of the self-positioning tangs mating with one hole of the first plurality of holes through the top cover for assisting with proper placement of the internal shield relative to the top portion, a plurality of horizontal mounting edges, each of the horizontal mounting edge of the plurality of horizontal mounting edges attached to one side shield surface of the plurality of side shield surfaces along the second edge of the side shield, and a first fastening means for securing the plurality of horizontal mounting edges to the top cover of the top portion and thereby securing the internal shield to the top portion; and a second fastening means for securing the top portion and the bottom cover to the printed circuit board after aligning the first plurality of grounding tangs and the second plurality of grounding tangs with the plurality of conductive channels through the conductive perimeter.

* * * * *

UNITED STATES PATENT AND TRADEMARK OFFICE
CERTIFICATE OF CORRECTION

PATENT NO. : 5,335,147
DATED : August 2, 1994
INVENTOR(S) : Weber

It is certified that error appears in the above-indentified patent and that said Letters Patent is hereby corrected as shown below:

Column 10, line 28, after "tangs", insert -- for --.

Signed and Sealed this

Third Day of October, 1995

Attest:

BRUCE LEHMAN

Attesting Officer    Commissioner of Patents and Trademarks